(12) United States Patent
Kim et al.

(10) Patent No.: US 11,508,312 B2
(45) Date of Patent: Nov. 22, 2022

(54) ORGANIC LIGHT EMITTING DISPLAY DEVICE

(71) Applicant: LG Display Co., Ltd., Seoul (KR)

(72) Inventors: Miso Kim, Paju-si (KR); YongMin Ha, Seoul (KR); Hanwook Hwang, Paju-si (KR); Minsu Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/484,556

(22) Filed: Sep. 24, 2021

(65) Prior Publication Data

US 2022/0189410 A1 Jun. 16, 2022

(30) Foreign Application Priority Data

Dec. 15, 2020 (KR) ........................ 10-2020-0175468

(51) Int. Cl.
*G09G 3/30* (2006.01)
*G09G 3/3266* (2016.01)
*H01L 27/32* (2006.01)

(52) U.S. Cl.
CPC ....... *G09G 3/3266* (2013.01); *H01L 27/3218* (2013.01); *H01L 27/3276* (2013.01)

(58) Field of Classification Search
CPC ... G09G 3/30; G09G 3/36; G09G 3/32; H01L 27/3218; H01L 27/3276
See application file for complete search history.

(56) References Cited

U.S. PATENT DOCUMENTS

| | | | |
|---|---|---|---|
| 2017/0338252 A1* | 11/2017 | Lee | H01L 27/1251 |
| 2022/0069037 A1* | 3/2022 | Kim | H01L 27/3218 |
| 2022/0069047 A1* | 3/2022 | Yang | H01L 27/3223 |
| 2022/0115454 A1* | 4/2022 | Ko | H01L 27/3218 |
| 2022/0165216 A1* | 5/2022 | Hong | H01L 27/3276 |

* cited by examiner

*Primary Examiner* — Pegeman Karimi
(74) *Attorney, Agent, or Firm* — Fenwick & West LLP

(57) ABSTRACT

An organic light emitting display device includes a first display area in which first sub-pixels are disposed, a second display area in which second sub-pixels are disposed in a density lower than the first display area, and a gate driver at least a part of which overlaps the second display area.

12 Claims, 9 Drawing Sheets

ORGANIC LIGHT EMITTING DISPLAY DEVICE

CROSS-REFERENCE TO RELATED APPLICATION

This application claims the priority benefit of Republic of Korea Patent Application No. 10-2020-0175468, filed on Dec. 15, 2020 in the Korean Intellectual Property Office, which is incorporated herein by reference in its entirety.

BACKGROUND

Field of the Disclosure

The present disclosure relates to organic light emitting display devices.

Description of the Background

Image display devices configured to display various information or data on a display screen act as a core device in the information and communication era. The display devices become thinner and lighter and are being developed to have high performance while being portable. In particular, there are growing needs for organic light emitting display devices that display an image by controlling the amount of light emitted from an organic light emitting element such as an organic light emitting diode.

The organic light emitting element is a self-emissive element using a thin emission layer between electrodes, and thus, can be thinner Indeed, the organic light emitting display devices can be configured in a relatively thin package because a back light is not required. A typical organic light emitting display device has a structure in which a pixel driving circuit and an organic light emitting element are formed over a substrate, and displays images by allowing light emitted from the organic light emitting element to pass through a substrate or a barrier layer.

Since the organic light emitting display device is implemented without a separate light source device, it can be easily implemented in various forms. A flexible material such as plastic, a thin metal foil, and the like may be used as a substrate of the organic light emitting display device to provide a variety of structures.

Meanwhile, recently, in most display devices, a display area in which an image is actually displayed tend to be maximized. Accordingly, various studies have been conducted to provide a broader display area on a limited plane of the display device, and in turn, attempts to minimize an area occupied by a non-display area outside of the display area have been conducted.

SUMMARY

Organic light emitting display devices are increasingly developed to satisfy various needs of users in many electronic devices including a display. In particular, displays have been developed for enabling users to feel more immersive and aesthetic through a maximized display screen, as well as functional satisfaction. To solve such needs and issues, according to embodiments of the present disclosure, an organic light emitting display device is provided that has a structure in which a size of an outer edge is reduced, and thus, a bigger display area is ensured. Issues or needs for solving in the present disclosure are not limited thereto, and other issues or needs will become apparent to those skilled in the art from the following description.

According to one aspect of the present disclosure, an organic light emitting display device is provided. The organic light emitting display device includes a first display area in which first sub-pixels are disposed, a second display area in which second sub-pixels are disposed in a density lower than the first display area, and a gate driver at least a part of which overlaps the second display area.

Each of the first sub-pixels or the second sub-pixels may include a pixel circuit including an oxide thin film transistor (TFT) and a low-temperature polycrystalline silicon thin film transistor (LTPS TFT). The gate driver may include a first scan driver that transmits a control signal to the oxide TFT and a second scan driver that transmits a control signal to the LTPS TFT. The gate driver may further include an emission driver.

The second scan driver may overlap the second display area. In this embodiment, the second scan driver may not overlap the pixel circuit of the second sub-pixel. A part of a buffer circuit included in the second scan driver may overlap the second display area.

The second sub-pixel can be driven to emit light with a higher luminance than the first sub-pixel.

The gate driver may be located on one side or both sides of the first display area. The second display area may be located on both sides of the first display area, and the gate driver may be located in a more outer edge than the second display area.

Various specific features, configurations, techniques and processes are included in detailed description and the accompanying drawings, and will be discussed in detail below.

According to embodiments of the present disclosure, it is possible to provide a display device in which the size and area of an outer edge thereof are reduced. According to embodiments of the present disclosure, it is possible to provide a display device with improved aesthetics and/or portability. According to embodiments of the present disclosure, it is possible to provide an organic light emitting display device capable of reducing or preventing image quality degradation. More specifically, according to embodiments of the present disclosure, it is possible to reduce an effect on perceived image quality according to viewing angles of the organic light emitting display device. Thus, the organic light emitting display device according to aspects of the present disclosure can provide improved usability in various environments. Effects according to aspects of the present disclosure are not limited to the above description and more various effects will be apparent in following description.

DETAILED DESCRIPTION

Figure 1:
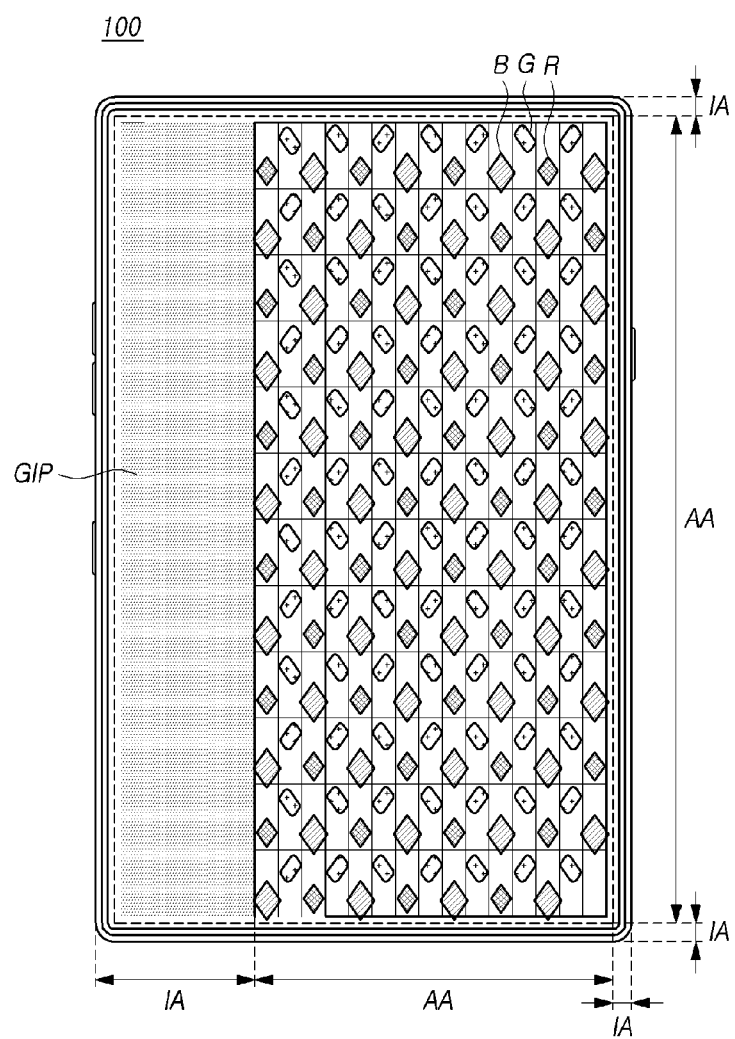
FIG. 1 is a plan view illustrating an organic light emitting display device according to aspects of the present disclosure.

The advantages and features of the present disclosure and methods of achieving the same will be apparent by referring to embodiments of the present disclosure as described below in detail in conjunction with the accompanying drawings. However, the present disclosure is not limited to the embodiments set forth below, but may be implemented in various different forms. The following embodiments are provided only to completely disclose the present disclosure and inform those skilled in the art of the scope of the present disclosure, and the present disclosure is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some embodiments of the present disclosure rather unclear. The terms such as "including", "having", "containing", "comprising of", and "consist of" used herein are generally intended to allow other components to be added unless the terms are used with the term "only". Singular forms used herein are intended to include plural forms unless the context clearly indicates otherwise. In interpreting any elements or features of the embodiments of the present disclosure, it should be considered that any dimensions and relative sizes of layers, areas and regions include a tolerance or error range even when a specific description is not conducted.

Spatially relative terms, such as, "on", "over", "above", "below", "under", "beneath", "lower", "upper", "near", "close", "adjacent", and the like, may be used to describe one element or feature's relationship to another element(s) or feature(s) as illustrated in the figures, and it should be interpreted that one or more elements may be further "interposed" between the elements unless the terms such as "directly", "only" are used. A location, arrangement, or disposition of a first element or layer "on" a second element or layer may include that not only is the first element or layer located, arranged, or disposed directly on the second element or layer, but a third element or layer is interposed between the first element or layer and the second element or layer. Herein, situations in which two or more elements included in embodiments of the present disclosure are connected, combined, coupled, contacted, or the like may include not only directly or physically connecting, combining, coupling, or contacting between two or more elements, but interposing of another element between the two or more elements.

When the terms, such as "first", "second", or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

The size and thickness of each component shown in the drawings are illustrated for convenience of description, and thus, embodiments of the present disclosure are not necessarily limited thereto. Hereinafter, with reference to the accompanying drawings, various embodiments of the present disclosure will be described in detail.

FIG. 1 is a plan view illustrating an organic light emitting display device according to aspects of the present disclosure.

Referring to FIG. 1, the organic light emitting display device 100 includes at least one display area AA, and at least one array of pixels is disposed in the display device 100. One pixel may include a plurality of sub-pixels. Here, each sub-pixel (R, G, and B) is a minimum element for emitting light of one color. A pixel circuit for driving one sub-pixel may include an organic light emitting element such as an organic light emitting diode, or the like, a plurality of transistors, and at least one capacitor, and a plurality of lines.

One or more non-display areas IA may be disposed outside of the display area AA, that is, in an outer edge of a corresponding display panel. The one or more non-display areas IA may be adjacent to, or contact, one or more side surfaces of the display area AA. FIG. 1 illustrates that the non-display area IA surrounds a rectangular display area. However, the shape of the display area AA and the shape and arrangement of the non-display area IA adjacent to, or contacting, the display area are not limited to the illustration of FIG. 1. The display area AA and the non-display area IA may have shapes suitable for designing an electronic device on which the display device 100 is mounted. In some embodiments, the shape of the display area AA are pentagonal, hexagonal, circular, oval or the like.

Each sub-pixel in the display area AA may be associated with a pixel circuit. The pixel circuit may include one or more switching transistors and one or more driving transistors. Each pixel circuit may be electrically connected to at least one signal line (a gate line, a data line, etc.) to communicate with a gate driver and a data driver located in the non-display area. The gate driver and the data driver can write data of an input image to pixels disposed in the display area AA by the control of a timing controller TCON.

The gate driver may be implemented with a thin film transistor (TFT) and the like disposed over a substrate of the non-display area IA. Such a gate driver may be referred to as a gate-in-panel (GIP). The gate driver GIP can output gate signals (SCAN, EM, etc.) by the control of the timing controller, and select pixels to which the data voltage is to be charged. The gate driver GIP may sequentially supply the gate signals to gate lines using at least one shift register. The gate driver GIP may be disposed in one or more non-display areas IA located on one side or two sides of the organic light emitting display device 100.

Some components, such as a data driver IC, may be mounted on a separate printed circuit board, and coupled to a connection interface (a pad, a bump, a pin, and/or the like) disposed in the non-display area through a circuit film such as a flexible printed circuit board (FPCB), a chip-on-film (COF), a tape-carrier-package (TCP), and/or the like. The printed circuit (COF, PCB, and/or the like) may be located in a rear portion of the display device 100.

The organic light emitting display device 100 may include various additional elements for generating various signals or driving pixels in the display area. As additional elements for driving the pixel, an inverter circuit, a multiplexer, an electrostatic discharge (ESD) circuit, and the like may be included in the display device 100. The organic light emitting display device 100 may also include additional elements related to functions other than pixel driving. For example, the organic light emitting display device 100 may include additional elements for providing a touch sensing function, a user authentication function (e.g., fingerprint recognition), a multi-level pressure sensing function, a tactile feedback function, and the like. The above-mentioned additional elements may be located in the non-display area IA and/or in an external circuit connected to the connection interface.

Figure 2:
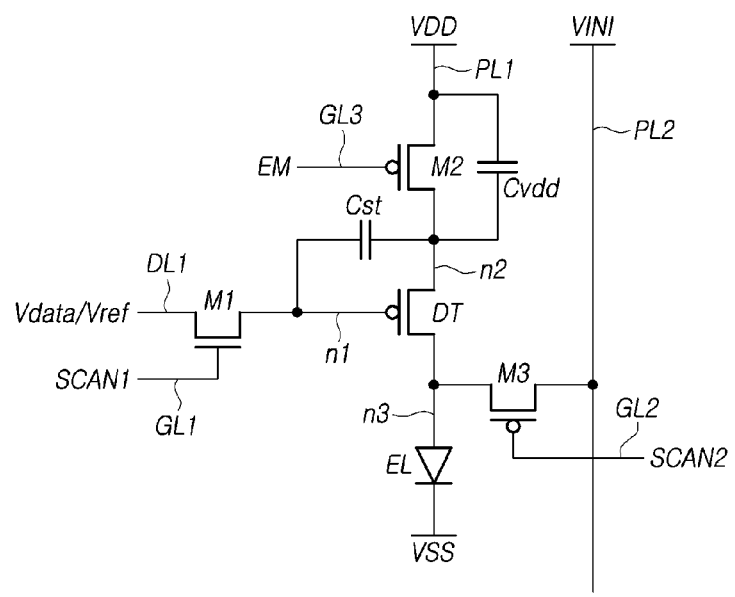
FIG. 2 illustrates a pixel circuit of the organic light emitting display device according to aspects of the present disclosure.

FIG. 2 illustrates a pixel circuit of the organic light emitting display device according to aspects of the present disclosure.

Each of the sub-pixels includes a pixel circuit. The pixel circuit may include an organic light emitting element EL, such as an organic light emitting diode, or the like, a plurality of thin film transistors (DT, M1, M2, and/or M3), and at least one capacitor (Cst, and/or Cvdd). The pixel circuit may be connected to a data line DL1 and at least one gate line (GL1, GL2, and/or GL3). The pixel circuit may be implemented using the circuit illustrated in FIG. 2; however, embodiments of the present disclosure are not limited thereto.

The pixel circuit according to embodiments of the present disclosure may include an oxide transistor and low temperature polysilicon (LTPS) transistors as illustrated in FIG. 2. The oxide thin film transistor (Oxide TFF) may be implemented using an n-type TFT (NMOS). An advantage of the oxide TFT is to have a small leakage current in the OFF state. The low temperature poly silicon thin film transistor (LTPS TFT) may be implemented as a p-type TFT (PMOS). The LTPS TFT has the characteristic of high carrier mobility, and thus, has advantages in driving efficiency and power consumption. The organic light emitting diode display according to aspects of the present disclosure can provide optimal functions by disposing an LPTS TFT and an oxide TFT having different characteristics in one pixel circuit.

As shown the pixel circuit of FIG. 2, gate signals such as a first gate signal SCAN1, a second gate signal SCAN2, a third gate signal EM, and the like can be applied to each sub-pixel. The pixel circuit may further include a first power line PL1 for supplying a pixel driving voltage VDD to the sub-pixel, a second power line PL2 for supplying an initialization voltage VINI to the sub-pixel, and a low power supply terminal VSS for supplying a low power supply voltage VSS to the sub-pixel. These power lines are connected to a power circuit.

The organic light emitting element EL may be implemented as an organic light emitting diode OLED. The organic light emitting element EL can emit light depending on an amount of current controlled by a driving TFT DT according to a data voltage Vdata. A current path of the organic light emitting element EL can be switched by a second TFT M2. The organic light emitting element EL can include an organic compound layer formed between an anode and a cathode. The organic compound layer may include a hole injection layer HIL, a hole transport layer HTL, an emission layer EML, an electron transport layer ETL, and an electron injection layer EIL; however, embodiments of the present disclosure are not limited thereto. The anode of the organic light emitting element EL may be connected to a third node n3, and the cathode thereof may be connected to the low power supply terminal VSS to which a low power supply voltage VSS is applied.

A first capacitor Cst may be connected between a first node n1 and a second node n2. The second capacitor Cvdd may be connected between the first power line PL1 to which a pixel driving voltage VDD is supplied and the second node n1. The pixel driving voltage VDD is supplied to the sub-pixel through the first power line PL1.

Figure 3:
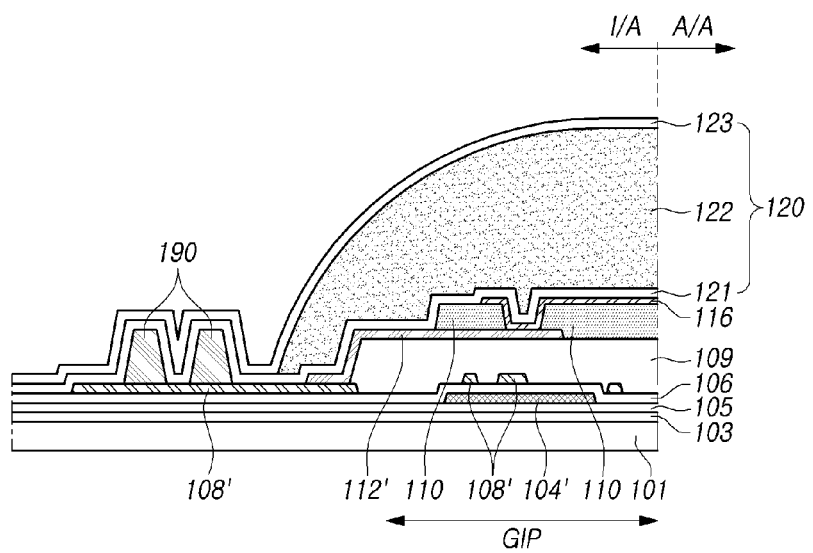
FIG. 3 illustrates a part of a non-display area of the organic light emitting display device according to aspects of the present disclosure.

FIG. 3 illustrates a part of a non-display area of the organic light emitting display device according to aspects of the present disclosure.

The organic light emitting display device may include a substrate 101, a thin film transistor, an organic light emitting element such as an organic light emitting diode, and various functional layers.

The substrate 101 can serve to support and protect elements of the organic light emitting display 100 disposed thereon. The substrate 101 may be a flexible substrate formed of a flexible material having a flexible characteristic. The substrate 101 may be a glass or plastic substrate. When the plastic substrate is employed, a polyimide-based or polycarbonate-based material may be used to have flexibility. In particular, polyimide is widely used as a plastic substrate because it can be applied to high-temperature processes and can be coated.

A buffer layer 103 may be employed as a functional layer for protecting electrodes and/or lines from impurities such as alkali ions leaking from the substrate 101 or one or more layers located under the buffer layer. The buffer layer may be formed of silicon oxide (SiOx), silicon nitride (SiNx), or made up of multiply layers including at least one of silicon oxide (SiOx) and silicon nitride (SiNx). The buffer layer 103 may include a multi-buffer and/or an active buffer. The multi-buffer may be formed by alternately stacking silicon nitride (SiNx) and silicon oxide (SiOx), and can cause the diffusion of moisture and/or oxygen penetrating into the substrate 101 to be delayed. The active buffer can protect a semiconductor layer of the transistor and prevent various types of defects introduced from the substrate 101. The active buffer may be formed of amorphous silicon (a-Si) or the like.

The thin film transistor includes a gate electrode, source and drain electrodes, and a semiconductor layer. The semiconductor layer may include amorphous silicon, polycrystalline silicon, or metal oxide. The semiconductor layer may include source and drain regions including p-type or n-type impurities, and a channel located between the source and drain regions, and include a lightly doped region between the source and drain regions adjacent to the channel.

The gate insulating layer 105 may be made up of either a single layer of silicon oxide (SiOx) or silicon nitride (SiNx), or multiple layers of at least one of silicon oxide (SiOx) and silicon nitride (SiNx), and be formed such that a current flowing through the semiconductor layer is not allowed to flow into the gate electrode.

An interlayer insulating layer 106 made up of either a single layer of silicon oxide (SiOx) or silicon nitride (SiNx), or multiple layers of at least one of silicon oxide (SiOx) and silicon nitride (SiNx) may be disposed between the gate electrode and the source and drain electrodes to insulate the gate electrode and the source and drain electrodes from each other.

A planarization layer 109 may be disposed on or over the thin film transistor. The planarization layer 109 can protect the thin film transistor, relieve a step difference caused by the thin film transistor, and reduce a parasitic capacitance formed between the thin film transistor, the gate line, the data line, and the organic light emitting element. The planarization layer 109 may be formed of at least one material of an acrylic resin, an epoxy resin, a phenolic resin, a polyamides resin, a polyimides resin, an unsaturated polyesters resin, a polyphenylene resin, a polyphenylenesulfides resin, and benzocyclobutene.

A bank 110 may be disposed on or over the anode and planarization layer 109 and may define an area that actually emits light. The bank 110 is formed by photolithography after forming a photoresist on the anode. The photoresist refers to a photosensitive resin whose solubility in a developer is changed by the action of light, and a specific pattern can be obtained by exposing and developing the photoresist.

The non-display area IA may be located outside of the display area AA as shown in FIG. 1, and a driving circuit (e.g., GIP), a power line, and the like may be disposed in the non-display area IA. Although the pixel circuit and the light emitting element are not disposed in the non-display area IA, the substrate 101 and organic/inorganic functional layers (103, 105, 106, 109, and the like) may be present in the non-display area IA. In addition, one or more materials used to form one or more elements located in the display area AA may be disposed in the non-display area IA for different usages. For example, the same metal 104' as the gate electrode, or the same metal 108' as the source or drain electrode, of a TFT disposed in the display area may form a line or an electrode in the non-display area IA. Furthermore, the same metal 112' as one electrode (e.g., anode) of an organic light emitting diode may form a line or an electrode in the non-display area IA.

An encapsulation layer 120 covers an upper portion of, or is disposed on or over, the organic light emitting element. The encapsulation layer may be made up of an inorganic film formed of glass, a metal, aluminum oxide (AlOx), or a silicon (Si)-based material, or may have a structure in which an organic film and an inorganic film are alternately stacked. The inorganic film 121, 123 can serve to block the penetration of moisture or oxygen, and the organic film 122 can serve to planarize the surface of the inorganic film 121.

The organic layer 122 has a certain degree of flowability, and may flow to the outside of the non-display area while the organic layer 122 is deposited. Accordingly, a blocking element 190 can control the spreading of the organic film 122 in the non-display area IA. Although FIG. 3 illustrates that two blocking elements (dams) are disposed in the non-display area; however, three or more dams may be disposed therein. In some embodiment, the dam 190 may surround the display area AA or may be disposed in the display area AA. The dam 190 may be made up of multiple layers using one or more materials. For example, the dam 190 may be formed of one or more materials used to form the planarization layer 109, a bank 110, and/or the like.

Various types of circuits and electrodes/wires disposed in the non-display area IA may be formed of a gate metal 104' and/or a source/drain metal 108'. The gate metal 104' may be formed of the same material, and in the same process, as the gate electrode of a TFT, and the source/drain metal 108' may be formed of the same material, and in the same process, as the source/drain electrode of the TFT.

For example, the source/drain metal may be used as a power line 108'(e.g., a low-level power (VSS) line, a high-level power (VDD) line, etc.). The power line 108' may be connected to a metal layer 112', and the cathode 116 of the organic light emitting diode can receive power through an electrical connection with the source/drain metal 108' and the metal layer 112'. The metal layer 112' may contact the power line 108', extend along an outermost sidewall of the planarization layer 109, and then contact the cathode 116 in an upper portion of the planarization layer 109. The metal layer 112' may be formed of the same material, and in the same process, as the anode of the organic light emitting diode.

Figure 4:
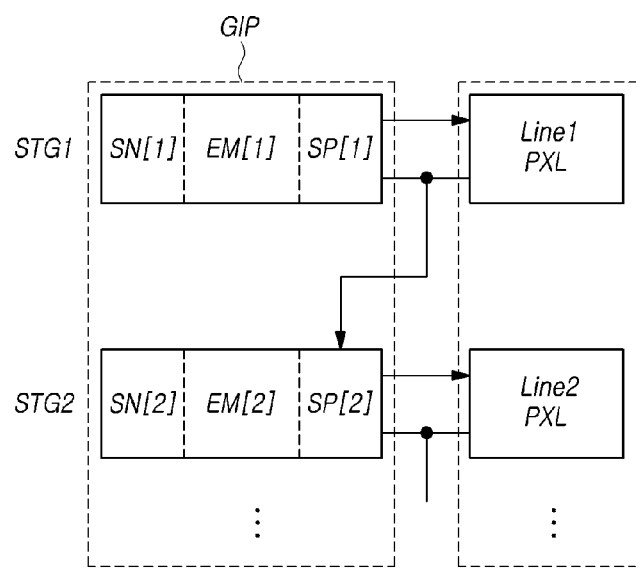
FIG. 4 illustrates a gate driver according to aspects of the present disclosure.
Figure 5A:
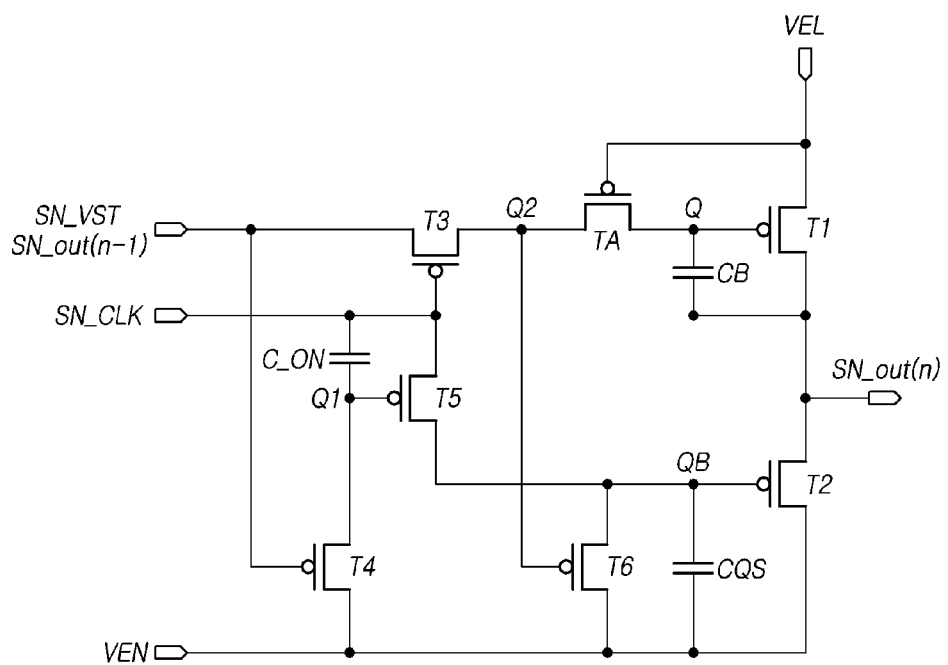
FIGS. 5A to 5C illustrate circuits included in the gate driver of FIG. 4 according to aspects of the present disclosure.
Figure 5B:
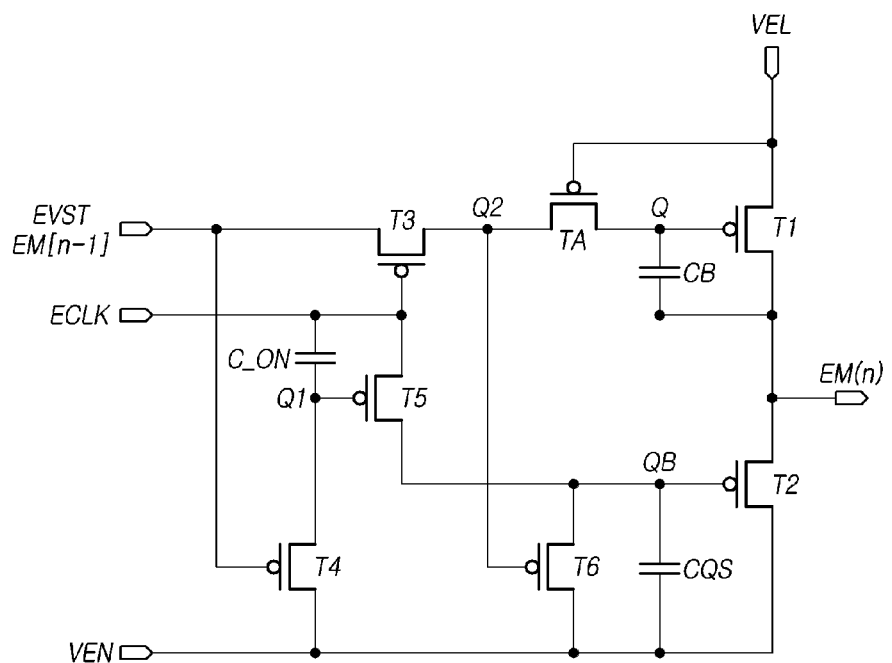
Figure 5C:
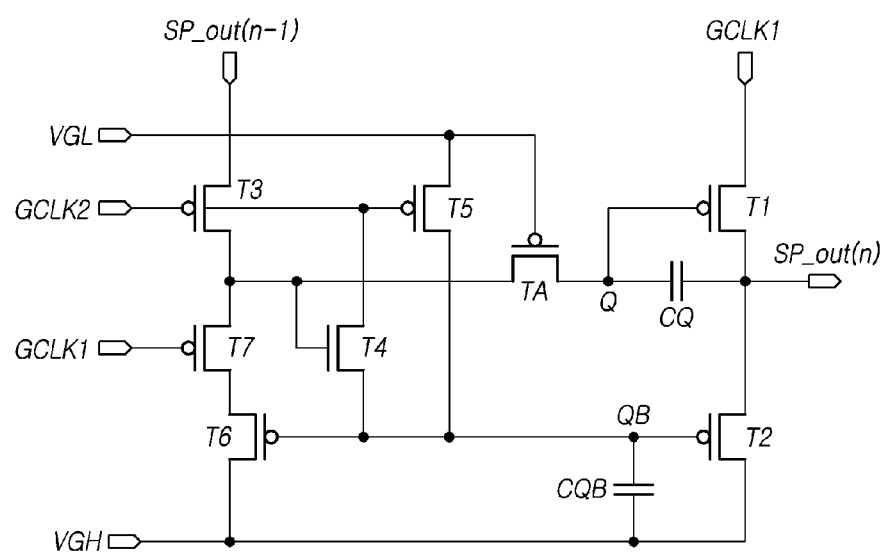

FIG. 4 illustrates a gate driver according to aspects of the present disclosure. FIGS. 5A to 5C illustrate circuits included in the gate driver of FIG. 4 according to aspects of the present disclosure.

The gate driver GIP may be implemented as a shift register including a plurality of stages. Each stage can output a scan signal with a gate-off voltage or a gate-on voltage according to voltages at node Q and node QB. The scan signal of the gate-off voltage is a voltage capable of turning off switching TFTs, and the scan signal of the gate-on voltage is a voltage capable of turning on the switching TFTs. In each stage, a scan signal of the gate-on voltage may be output while node Q is activated, and a scan signal of the gate-off voltage may be output while node QB is activated. The gate driver GIP may include a scan driver (SN[n], and/or SP[n]) for generating a scan signal SCAN and an emission driver EM[n] for generating an emission signal EM.

The scan driver (SN[n], and/or SP[n]) can supply a scan signal SCAN to corresponding gate lines in a line-sequential manner. The scan driver according to embodiments of the present disclosure may include a first scan driver SN[n] providing a scan signal to the oxide TFT and a second scan driver SP[n] providing a scan signal to the LTPS TFT.

The emission driver EM[n] can supply an emission signal EM to corresponding gate lines in a line-sequential manner. The emission driver EM may be implemented as a shift register including a plurality of stages. In some embodiments, the emission driver EM[n] may be located between the first scan driver SN[n] and the second scan driver SP[n].

FIG. 5A is an example circuit of the first scan driver SN[n], FIG. 5B is an example circuit of the emission driver EM[n], and FIG. 5C is an example circuit of the second scan driver SP[n].

The first scan driver SN[n] may include seven transistors T1, T2, T3, T4, T5, T6, and TA and three capacitors CQ, CQB, and C_ON. A connection relationship between these transistors and these capacitors is shown in FIG. 5A. The second scan driver SP[n] may include eight transistors T1, T2, T3, T4, T5, T6, T7, and TA and two capacitors CQ, and CQB. A connection relationship between these transistors and these capacitors is shown in FIG. 5C.

The emission driver EM[n] may include seven transistors T1, T2, T3, T4, T5, T6, and TA and three capacitors CB, CQB, and C_ON in a structure similar to the first scan driver SN[n]. A connection relationship between these transistors and these capacitors is shown in FIG. 5B.

However, it is difficult for the gate driver to be implemented to have a narrow bezel due to the complexity and layout limitations of the shift register circuit and an inverter circuit. To address this issue, the inventors of the present disclosure developed a structure capable of effectively disposing the gate driver (GIP) in a smaller area.

Figure 6:
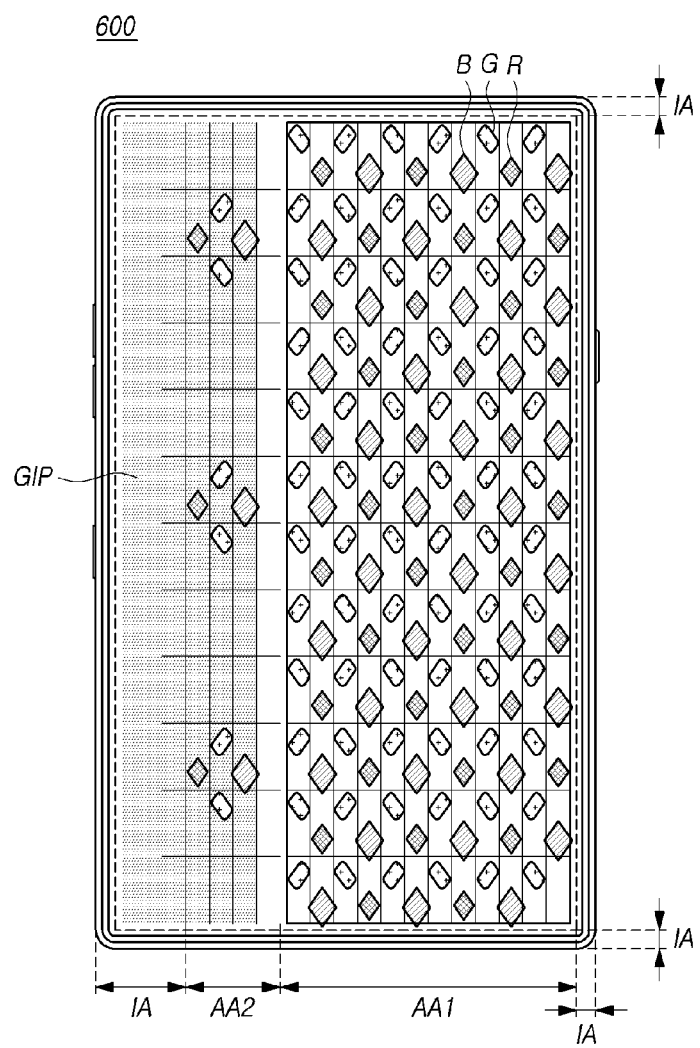
FIG. 6 illustrates sub-pixels and a gate driver of an organic light emitting display device according to aspects of the present disclosure.
Figure 7:
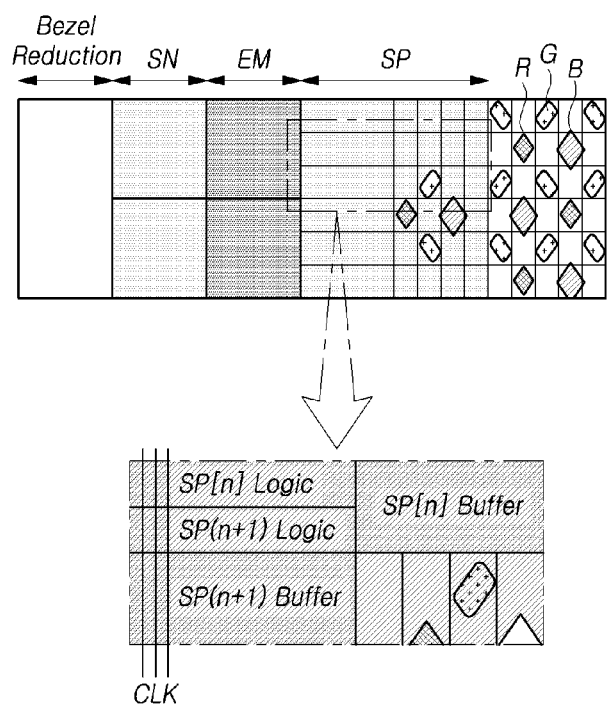
FIG. 7 is an expanded view of a part in FIG. 6.

FIG. 6 illustrates sub-pixels and a gate driver of an organic light emitting display device according to aspects of the present disclosure. FIG. 7 is an expanded view of a part in FIG. 6.

Among elements of FIG. 6, discussions on elements substantially equal to those of FIGS. 1 to 4 will not be repeatedly given for convenience of description. The organic light emitting display device 600 has an arrangement structure of the gate driver GIP capable of reducing a size of an edge area (bezel area). In an embodiment, the organic light emitting display device 600 can have a structure in which by arranging the gate driver GIP to overlap the display area, a corresponding bezel area is reduced, and pixels are disposed in a different pattern in the overlapped area. Hereinafter, the organic light emitting display device 600 will be described with reference to FIGS. 6 and 7.

The organic light emitting display device 600 includes a display area AA1 and AA2 and a non-display area IA located outside of the display area. The display area may be divided into a first display area AA1 and a second display area AA2. First pixels may be disposed in the first display area AA1, and second pixels may be disposed in the second display area AA2 adjacent to the first display area AA1.

The second display area AA2 may be positioned on one side or both sides of the first display area AA1. FIG. 6 illustrates that the second display area AA2 is located on one side (left side) of the first display area AA1.

The gate driver GIP may be located on one side or both sides of the first display area AA1 The gate driver GIP may be located in a more outer edge of the organic light emitting display device 600 than the second display area AA2. FIG. 6 illustrates that the gate driver GIP is located on one side (left side) of the first display area AA1 and is located in a more left outer edge of the organic light emitting display device 600 than the second display area AA2.

Each of the first pixels and the second pixels may include one or more sub-pixels. Each of the sub-pixels R, G, and B may include an organic light emitting element such as an organic light emitting diode, a pixel circuit, at least one line, at least one electrode, and the like. Although pixels each including red (R), green (G), and blue (B) sub-pixels are illustrated in FIG. 6, embodiments of the present disclosure are not limited thereto. For example, the pixel may further include a white sub-pixel. Also, although FIG. 6 illustrates that the sub-pixels arranged in the first display area AA1 and the second display area AA2 have substantial equal sizes/shapes, the sizes/shapes of the respective sub-pixels in both areas may be different from each other.

The density (or resolution) of the second pixels disposed in the second display area AA2 may be lower than that of the first pixels disposed in the first display area AA1. That is, the number of pixels (sub-pixels) per unit area in the second display area AA2 may be smaller than that of the first display area AA1.

The first and second sub-pixels may include respective pixel circuits for controlling light emission. Each of the first sub-pixels and/or the second sub-pixels may include a pixel circuit including an oxide thin film transistor (TFT) and a low-temperature polycrystalline silicon thin film transistor (LTPS TFT). That is, each of the first sub-pixels and/or the second sub-pixels may include a pixel circuit in which an oxide TFT and an LTPS TFT are included, as illustrated in FIG. 2.

As the sub-pixels provided in the display areas AA1 and AA2 include several types of TFTs, the gate driver GIP may be implemented according to such a configuration. In an embodiment, the gate driver may include a first scan driver SN that transmits a control signal to the oxide TFT and a second scan driver SP that transmits a control signal to the low-temperature polycrystalline silicon thin film transistor (LTPS TFT). The first scan driver SN and the second scan driver SP respectively may include a logic circuit for generating a control signal, and a buffer circuit for transmitting the generated control signal.

The gate driver may further include an emission driver EM that generates/transmits an emission control signal to the pixel circuit. In an embodiment, the emission driver EM may correspond to one block located between the first scan driver SN and the second scan driver SP.

As described above, the gate driver GIP having the structure shown in FIG. 4 occupies a large area due to the complexity of the circuit. However, the organic light emitting display device 600 according to embodiments of the present disclosure can have extra space outside of the first display area AA1, that is, in the second display area AA2 adjacent to the gate driver GIP. This extra space is provided as pixels are arranged at a low resolution, and when a part of the gate driver GIP is disposed in this space, the gate driver GIP may be located closer to the display area. Accordingly, as the size of the non-display area IA occupied by the gate driver GIP becomes smaller, the width of the bezel area can be reduced compared to the typical structure.

In an embodiment, as shown in FIG. 7, the gate driver GIP may be disposed such that the second display area AA2 and a gate driver (e.g., the second scan driver SP) adjacent thereto overlap each other. This overlapped configuration of the second display area AA2 and the gate driver can be provided because the second display area AA2 having a low resolution includes a plurality of portions in which sub-pixels are not disposed. That is, since the sub-pixels in the second display area AA2 are arranged sparsely compared to those of the first display area AA1, the gate driver GIP can be placed in an empty portion where the sub-pixel circuit is not present.

In the case of FIG. 7, the second display area AA2 is located next to the first display area AA1, and the gate driver GIP is located adjacent to the second display area AA2. Further, in the gate driver GIP, the second scan driver SP, the emission driver EM, and the first scan driver SN are sequentially arranged in a direction that moves away from the second display area AA2. In this arrangement relationship, at least a portion of the second scan driver SP can overlap the second display area AA2. In this situation, the second scan driver SP may be located in an empty portion of the second display area AA2 and not overlap the pixel circuit of the second sub-pixel. This may be for convenience of a corresponding arrangement design.

Referring to the illustration of FIG. 7, a portion of the buffer circuit SP[n] included in the second scan driver SP may overlap the second display area AA2. That is, in a situation where the second scan driver SP[n] is disposed in a row different from a sub-pixel, as extra space is obtained by moving a corresponding buffer circuit SP[n] over (or under) the sub-pixel, a portion (e.g., SP[n+1] Logic) of an associated logic circuit in a lower row (or an upper row) may be disposed in the extra space. As a result, the corresponding scan driver in the lower row (or the upper row) can be disposed with more space. In particular, the arrangement space of the scan drivers SP[n+1] disposed in the same row as the sub-pixel may be significantly increased.

Since the resolutions of the first display area AA1 and the second display area AA2 are different from each other, a boundary line therebetween may be recognized unusually. Since the boundary line may be recognized as a dark line or a bright line, and thus display quality may be deteriorated, it is needed to apply a technique to address these issues to the organic light emitting display device 600 according to aspects of the present disclosure.

To do this, the first sub-pixel of the first display area AA1 and the second sub-pixel of the second display area AA2 can be driven in different schemes. In an embodiment, the second sub-pixel can be driven to emit light with a higher luminance than the first sub-pixel. This is to compensate for a difference in brightness that occurs because the number of pixels in the second display area AA2 is small. Such compensation may be implemented by differently controlling a gamma value, a gain value, and the like for each area.

Meanwhile, in order to alleviate boundary visibility, the organic light emitting display device 600 according to embodiments of the present disclosure may drive some sub-pixels of the first display area AA1 disposed at the boundary with the second display area AA2 differently from one or more other sub-pixels. For example, a sub-pixel located at the boundary may be driven with an intermediate luminance between a sub-pixel of the second display area AA2 and a sub-pixel of the first display area AA1.

The above description has been presented to enable any person skilled in the art to make and use the invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

The scope of protection of the present disclosure is to be construed according to the claims, and all technical ideas within the scope of the claims should be interpreted as being included in the scope of the present invention.

What is claimed is:

1. An organic light emitting display device comprising:
a first display area in which first sub-pixels are disposed;
a second display area in which second sub-pixels are disposed in a density lower than the first display area; and
a gate driver at least a part of which overlaps the second display area,
wherein each of the first sub-pixels or the second sub-pixels includes a pixel circuit including an oxide thin film transistor and a low-temperature polycrystalline silicon thin film transistor, and
wherein the gate driver includes a first scan driver that transmits a first control signal to the oxide thin film transistor and a second scan driver that transmits a second control signal to the low-temperature polycrystalline silicon thin film transistor.

2. The organic light emitting display device according to claim 1, wherein the gate driver further comprises an emission driver.

3. The organic light emitting display device according to claim 1, wherein the second scan driver overlaps the second display area.

4. The organic light emitting display device according to claim 3, wherein the second scan driver does not overlap the pixel circuit of the second sub-pixel.

5. The organic light emitting display device according to claim 3, wherein a part of a buffer circuit included in the second scan driver overlaps the second display area.

6. The organic light emitting display device according to claim 1, wherein the second sub-pixel is driven to emit light with a higher luminance than the first sub-pixel.

7. The organic light emitting display device according to claim 1, wherein the gate driver is located on one side or both sides of the first display area.

8. The organic light emitting display device according to claim 1, wherein the second display area is located on both sides of the first display area, and
the gate driver is located in a more outer edge than the second display area.

9. The organic light emitting display device according to claim 1, wherein the first gate driver and the second gate driver are sequentially arranged in a direction close to the second display area from a bezel area.

10. The organic light emitting display device according to claim 9, wherein an emission driver is further disposed between the first gate driver and the second gate driver.

11. The organic light emitting display device according to claim 1, wherein the first scan driver and the second scan driver comprise logic circuits for generating the first and second control signals, respectively, and buffer circuits for transmitting the generated first and second control signals, respectively.

12. The organic light emitting display device according to claim 1, wherein one or more of the first sub-pixels located in a boundary area between the first display area and the second display area are driven with an intermediate luminance between luminance of the remaining of the first sub-pixels and luminance of the second sub-pixels.

* * * * *